United States Patent
Wright et al.

(10) Patent No.: US 10,418,990 B2
(45) Date of Patent: *Sep. 17, 2019

(54) LOAD DRIVER

(71) Applicant: Monterey Research, LLC, Santa Clara, CA (US)

(72) Inventors: David G. Wright, Woodinville, WA (US); Jason Faris Muriby, San Diego, CA (US); Erhan Hancioglu, Bothell, WA (US)

(73) Assignee: MONTEREY RESEARCH, LLC, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/921,403

(22) Filed: Mar. 14, 2018

(65) Prior Publication Data

US 2018/0205376 A1    Jul. 19, 2018

Related U.S. Application Data

(63) Continuation of application No. 14/829,938, filed on Aug. 19, 2015, now Pat. No. 9,923,559, which is a continuation of application No. 14/066,263, filed on Oct. 29, 2013, now Pat. No. 9,124,264, which is a continuation of application No. 13/100,876, filed on May 4, 2011, now Pat. No. 8,570,073, which is a continuation of application No. 11/843,216, filed on Aug. 22, 2007, now Pat. No. 8,164,365.

(60) Provisional application No. 60/912,577, filed on Apr. 18, 2007.

(51) Int. Cl.
*H03K 19/00*     (2006.01)
*H03K 17/687*    (2006.01)
*H03K 19/003*    (2006.01)

(52) U.S. Cl.
CPC ....... *H03K 17/687* (2013.01); *H03K 19/0016* (2013.01); *H03K 19/00369* (2013.01)

(58) Field of Classification Search
None
See application file for complete search history.

(56) References Cited

U.S. PATENT DOCUMENTS

| | | |
|---|---|---|
| 4,061,987 A | 12/1977 | Nagahama |
| 4,075,536 A | 2/1978 | Stevens |
| 4,242,604 A | 12/1980 | Smith |
| 4,272,760 A | 6/1981 | Prazak et al. |

(Continued)

FOREIGN PATENT DOCUMENTS

| | | |
|---|---|---|
| EP | 1625506 B1 | 2/2006 |
| JP | 63287113 A | 11/1988 |

(Continued)

OTHER PUBLICATIONS

L. Richard Carley, "Trimming Analog Circuits Using Floating-Gate Analog MOS Memory", IEEE Journal of Solid-State Circuits, voll. 24, No. 6, Dec. 1989, pp. 1569-1575.

(Continued)

*Primary Examiner* — Long Nguyen
(74) *Attorney, Agent, or Firm* — Kunzler Bean & Adamson

(57) ABSTRACT

A method for driving a load includes driving a load to an initial voltage within a voltage window, the voltage window based on an input voltage and an offset voltage, and driving the load to approximately the input voltage.

8 Claims, 3 Drawing Sheets

(56) References Cited

U.S. PATENT DOCUMENTS

| | | |
|---|---|---|
| 4,344,067 A | 8/1982 | Lee |
| 4,571,507 A | 2/1986 | Collings |
| 4,684,824 A | 8/1987 | Moberg |
| 4,689,581 A | 8/1987 | Talbot |
| 4,689,740 A | 8/1987 | Moelands et al. |
| 4,692,718 A | 9/1987 | Roza et al. |
| 4,692,760 A | 9/1987 | Unno et al. |
| 4,736,123 A | 4/1988 | Miyazawa et al. |
| 4,797,580 A | 1/1989 | Sunter |
| 4,839,636 A | 6/1989 | Zeiss |
| 4,855,683 A | 8/1989 | Troudet et al. |
| 4,868,525 A | 11/1989 | Dias |
| 4,882,549 A | 11/1989 | Galani et al. |
| 4,947,169 A | 8/1990 | Smith et al. |
| 4,980,653 A | 12/1990 | Shepherd |
| 4,988,983 A | 1/1991 | Wehrer |
| 5,019,729 A | 5/1991 | Kimura et al. |
| 5,036,300 A | 8/1991 | Anholm, Jr. et al. |
| 5,073,757 A | 12/1991 | George |
| 5,095,280 A | 3/1992 | Wunner et al. |
| 5,111,081 A | 5/1992 | Atallah |
| 5,140,197 A | 8/1992 | Grider |
| 5,142,247 A | 8/1992 | Lada, Jr. et al. |
| 5,144,254 A | 9/1992 | Wilke |
| 5,150,079 A | 9/1992 | Williams et al. |
| 5,175,884 A | 12/1992 | Suarez |
| 5,200,751 A | 4/1993 | Smith |
| 5,268,599 A | 12/1993 | Matsui |
| 5,289,138 A | 2/1994 | Wang |
| 5,304,955 A | 4/1994 | Atriss et al. |
| 5,321,319 A | 6/1994 | Mahmood |
| 5,345,195 A | 9/1994 | Cordoba et al. |
| 5,349,544 A | 9/1994 | Wright et al. |
| 5,355,033 A | 10/1994 | Jang |
| 5,381,116 A | 1/1995 | Nuckolls et al. |
| 5,408,191 A | 4/1995 | Han et al. |
| 5,420,543 A | 5/1995 | Lundberg et al. |
| 5,428,319 A | 6/1995 | Marvin et al. |
| 5,432,665 A | 7/1995 | Hopkins |
| 5,440,305 A | 8/1995 | Signore et al. |
| 5,446,867 A | 8/1995 | Young et al. |
| 5,451,912 A | 9/1995 | Torode |
| 5,473,285 A | 12/1995 | Nuckolls et al. |
| 5,481,179 A | 1/1996 | Keeth |
| 5,495,205 A | 2/1996 | Parker et al. |
| 5,506,875 A | 4/1996 | Nuckolls et al. |
| 5,508,715 A | 4/1996 | Kuroki |
| 5,511,100 A | 4/1996 | Lundberg et al. |
| 5,525,933 A | 6/1996 | Matsuki et al. |
| 5,546,433 A | 8/1996 | Tran et al. |
| 5,552,748 A | 9/1996 | O'Shaughnessy |
| 5,554,942 A | 9/1996 | Herr et al. |
| 5,559,502 A | 9/1996 | Schutte |
| 5,563,553 A | 10/1996 | Jackson |
| 5,565,819 A | 10/1996 | Cooper |
| 5,583,501 A | 12/1996 | Henrion et al. |
| 5,589,783 A | 12/1996 | McClure |
| 5,594,612 A | 1/1997 | Henrion |
| 5,604,466 A | 2/1997 | Dreps et al. |
| 5,608,770 A | 3/1997 | Noguchi et al. |
| 5,610,550 A | 3/1997 | Furutani |
| 5,610,955 A | 3/1997 | Bland |
| 5,614,869 A | 3/1997 | Bland |
| 5,642,027 A | 6/1997 | Windes et al. |
| 5,644,254 A | 7/1997 | Boudry |
| 5,666,118 A | 9/1997 | Gersbach |
| 5,668,506 A | 9/1997 | Watanabe et al. |
| 5,670,915 A | 9/1997 | Cooper et al. |
| 5,673,004 A | 9/1997 | Park |
| 5,675,813 A | 10/1997 | Holmdahl |
| 5,682,049 A | 10/1997 | Nguyen |
| 5,686,863 A | 11/1997 | Whiteside |
| 5,689,196 A | 11/1997 | Schutte |
| 5,699,024 A | 12/1997 | Manlove et al. |
| 5,703,537 A | 12/1997 | Bland et al. |
| 5,726,597 A | 3/1998 | Petty et al. |
| 5,729,165 A | 3/1998 | Lou et al. |
| 5,739,700 A * | 4/1998 | Martin ............ H03K 19/01852 326/17 |
| 5,796,312 A | 8/1998 | Hull et al. |
| 5,805,909 A | 9/1998 | Diewald |
| 5,818,370 A | 10/1998 | Sooch et al. |
| 5,825,317 A | 10/1998 | Anderson et al. |
| 5,845,151 A | 12/1998 | Story et al. |
| 5,845,181 A | 12/1998 | Bartscher |
| 5,867,015 A | 2/1999 | Corsi et al. |
| 5,870,004 A | 2/1999 | Lu |
| 5,870,345 A | 2/1999 | Stecker |
| 5,872,464 A | 2/1999 | Gradinariu |
| 5,877,656 A | 3/1999 | Mann et al. |
| 5,898,345 A | 4/1999 | Namura et al. |
| 5,949,408 A | 9/1999 | Kang et al. |
| 6,040,707 A | 3/2000 | Young et al. |
| 6,118,439 A | 9/2000 | Ho et al. |
| 6,124,840 A | 9/2000 | Kwon |
| 6,141,007 A | 10/2000 | Lebling et al. |
| 6,157,266 A | 12/2000 | Tsai et al. |
| 6,191,660 B1 | 2/2001 | Mar et al. |
| 6,199,969 B1 | 3/2001 | Haflinger et al. |
| 6,204,831 B1 | 3/2001 | Nishioka et al. |
| 6,211,739 B1 | 4/2001 | Snyder et al. |
| 6,215,835 B1 | 4/2001 | Kyles |
| 6,219,736 B1 | 4/2001 | Klingman |
| 6,225,992 B1 | 5/2001 | Hsu et al. |
| 6,266,715 B1 | 7/2001 | Loyer et al. |
| 6,294,962 B1 | 9/2001 | Mar |
| 6,297,705 B1 | 10/2001 | Williams et al. |
| 6,319,370 B1 | 11/2001 | Sun et al. |
| 6,357,011 B2 | 3/2002 | Gilbert |
| 6,407,641 B1 | 6/2002 | Williams et al. |
| 6,433,645 B1 | 8/2002 | Mann et al. |
| 6,466,036 B1 | 10/2002 | Phiipp |
| 6,515,551 B1 | 2/2003 | Mar et al. |
| 6,525,616 B1 | 2/2003 | Williams et al. |
| 6,646,514 B2 | 11/2003 | Sutliff et al. |
| 6,701,508 B1 | 3/2004 | Bartz et al. |
| 6,708,223 B1 | 3/2004 | Fuller et al. |
| 6,708,247 B1 | 3/2004 | Barret et al. |
| 6,710,788 B1 | 3/2004 | Freach et al. |
| 6,742,076 B2 | 5/2004 | Wang et al. |
| 6,753,739 B1 | 6/2004 | Mar et al. |
| 6,801,178 B2 | 10/2004 | Nitta et al. |
| 6,807,109 B2 * | 10/2004 | Tomishima ...... G01R 31/31723 365/189.05 |
| 6,812,678 B1 | 11/2004 | Brohlin |
| 6,909,414 B2 | 6/2005 | Tsuchi et al. |
| 6,922,063 B2 | 7/2005 | Heger |
| 6,946,920 B1 | 9/2005 | Williams et al. |
| 6,960,953 B2 | 11/2005 | Ichihara |
| 6,961,665 B2 | 11/2005 | Slezak |
| 6,966,039 B1 | 11/2005 | Bartz et al. |
| 6,989,659 B2 | 1/2006 | Menegoli et al. |
| 7,010,773 B1 | 3/2006 | Bartz et al. |
| 7,078,941 B2 * | 7/2006 | Tsuchi ................ G09G 3/3685 327/108 |
| 7,139,999 B2 | 11/2006 | Bowman-Amuah |
| 7,170,257 B2 | 1/2007 | Oh |
| 7,212,183 B2 | 5/2007 | Tobita |
| 7,276,977 B2 | 10/2007 | Self |
| 7,319,999 B2 | 1/2008 | Evans |
| 7,348,861 B1 | 3/2008 | Wu et al. |
| 7,375,593 B2 | 5/2008 | Self |
| 7,391,204 B2 | 6/2008 | Bicking |
| 7,397,226 B1 | 7/2008 | Mannama et al. |
| 7,439,777 B2 | 10/2008 | Wood |
| 7,446,747 B2 | 11/2008 | Youngblood et al. |
| 7,576,582 B2 | 8/2009 | Lee et al. |
| 7,600,156 B2 | 10/2009 | Thornley et al. |
| 7,612,527 B2 | 11/2009 | Hoffman et al. |
| 7,631,111 B2 | 12/2009 | Monks et al. |
| 7,667,708 B2 | 2/2010 | Kamijo et al. |
| 7,932,774 B2 | 4/2011 | Bonaccio et al. |
| 8,085,020 B1 | 12/2011 | Bennett |

(56) References Cited

U.S. PATENT DOCUMENTS

| | | | |
|---|---|---|---|
| 8,164,365 B2* | 4/2012 | Wright | H03K 19/00369 327/108 |
| 8,570,073 B2* | 10/2013 | Wright | H03K 19/00369 327/108 |
| 9,124,264 B2* | 9/2015 | Wright | H03K 19/00369 |
| 9,923,559 B2* | 3/2018 | Wright | H03K 19/00369 |
| 2001/0040569 A1 | 11/2001 | Liang | |
| 2002/0011979 A1 | 1/2002 | Nitta et al. | |
| 2002/0033804 A1 | 3/2002 | Liang et al. | |
| 2002/0035618 A1 | 3/2002 | Mendez et al. | |
| 2003/0112215 A1 | 6/2003 | Hector et al. | |
| 2003/0122734 A1 | 7/2003 | Chien et al. | |
| 2003/0233631 A1 | 12/2003 | Curry et al. | |
| 2004/0046724 A1 | 3/2004 | Woo et al. | |
| 2004/0056833 A1 | 3/2004 | Kitagawa et al. | |
| 2004/0070559 A1 | 4/2004 | Liang | |
| 2004/0145551 A1 | 7/2004 | Tobita | |
| 2004/0189573 A1 | 9/2004 | Lee et al. | |
| 2004/0201627 A1 | 10/2004 | Maddocks et al. | |
| 2004/0217799 A1 | 11/2004 | Ichihara | |
| 2004/0250231 A1 | 12/2004 | Killian et al. | |
| 2005/0052394 A1 | 3/2005 | Waterman | |
| 2005/0057482 A1 | 3/2005 | Youngblood et al. | |
| 2005/0140659 A1 | 6/2005 | Hohl et al. | |
| 2006/0001671 A1 | 1/2006 | Kamijo et al. | |
| 2006/0033474 A1 | 2/2006 | Shum | |
| 2006/0192791 A1 | 8/2006 | Schick et al. | |
| 2006/0239746 A1 | 10/2006 | Grant | |
| 2006/0244739 A1 | 11/2006 | Tsai | |
| 2006/0255860 A1 | 11/2006 | Moussavi | |
| 2007/0002007 A1 | 1/2007 | Tam | |
| 2007/0024544 A1 | 2/2007 | Chung et al. | |
| 2007/0029975 A1 | 2/2007 | Martin et al. | |
| 2007/0139338 A1 | 6/2007 | Lin et al. | |
| 2007/0139403 A1 | 6/2007 | Chung | |
| 2007/0159425 A1 | 7/2007 | Knepper et al. | |
| 2007/0170931 A1 | 7/2007 | Snyder | |
| 2008/0036473 A1 | 2/2008 | Jansson | |
| 2008/0123238 A1 | 5/2008 | Campos et al. | |
| 2008/0131145 A1 | 6/2008 | Tao et al. | |
| 2008/0203977 A1 | 8/2008 | Raimar et al. | |
| 2008/0224667 A1 | 9/2008 | Tanaka et al. | |
| 2008/0258740 A1 | 10/2008 | Wright et al. | |
| 2008/0258797 A1 | 10/2008 | Wright et al. | |
| 2008/0259017 A1 | 10/2008 | Wright et al. | |
| 2008/0259065 A1 | 10/2008 | Wright et al. | |
| 2008/0259070 A1 | 10/2008 | Snyder et al. | |
| 2008/0263243 A1 | 10/2008 | Wright et al. | |
| 2008/0263260 A1 | 10/2008 | Snyder et al. | |
| 2009/0054129 A1 | 2/2009 | Yoshimura et al. | |
| 2011/0234264 A1 | 9/2011 | Wright et al. | |
| 2011/0248692 A1 | 10/2011 | Shehu et al. | |
| 2012/0013322 A1 | 1/2012 | Dearborn | |

FOREIGN PATENT DOCUMENTS

| | | | |
|---|---|---|---|
| JP | 2291161 A | | 11/1990 |
| JP | 3297223 A | | 12/1991 |
| JP | 5041651 A | | 2/1993 |
| WO | 8906456 A1 | | 7/1989 |
| WO | 9617305 | | 6/1996 |
| WO | 9736230 A1 | | 10/1997 |
| WO | 9834376 | | 8/1998 |
| WO | 9909712 A2 | | 2/1999 |

OTHER PUBLICATIONS

"An Analog PPL-Based Clock and Data Recovery Circuit with High Input Jitter Tolerance", Sun, Reprinted from IEEE Journal of Solid-State Circuits, 1989, pp. 1-4.

"PSoC Mixed Signal Array", Final Data Sheet, Cypress Semiconductor Corporation, Apr. 24, 2007, Document No. 001-05356, pp. 1-31.

Bakker et al., "Micropower CMOS Temperature Sensor with Digital Output", IEEE Journal of Solid-State Circuits, Jul. 1996, pp. 1-3.

Cacharelis et al., "A Fully Modular 1 um CMOS Technology Incorporating EEPROM, EPROM and Interpoly Capacitors", 20th European Solid State Device Research Conference, Nottingham, Sep. 1990, pp. 547-550.

Cacharelis et al.,"A Modular 1 um CMOS Single Polysilicon EPROM PLD Technology", Aug. 1988 IEEE, pp. 60-IEDM 88 to 63-IEDM88.

Cuppens et al., "An EEPROM for Microprocessors and Custom Logic", IEEE Journal of Solid-State Circuits, vol. SC-20, No. 2, Apr. 1985, pp. 603-608.

"CY7C63221/31 enCoRe USB Low-Speed USB Peripheral Controller", Cypress Semiconductor Corporation, Revised May 2000, pp. 1-40.

"CY7C63722/23 CY7C63742/43 enCoRe USB Combination Low-Speed USB & PS/2 Peripheral Controller", Cypress Semiconductor Corporation, Revised May 2000, pp. 1-48.

Cypress Semiconductor Marketing Brochure, "Timing Technology Products", Published Nov. 1993, a publication of Cypress Semiconductor in San Jose, CA, pp. 1-5.

Electronic Engineering Times, "TI's Quantum Leap", Issue 517, Dec. 19, 1988, pp. 1 and 86.

Frake et al., "A 9ns, Low Standby Power CMOS PLD with a Single-Poly EPROM Cell", 1989 IEEE International Solid-State Circuits Conference, Feb. 17, 1989, pp. 230-231 and 346.

Hoe et al.,"Cell and Circuit Design for Single-Poly EPROM", IEEE Journal of Solid-State Circuits, vol. 24, No. 4, Aug. 1989, pp. 1153-1157.

Jan Axelson, "USB Complete: Everything You Need to Develop USB Peripherals", 3rd Edition, Copyright 1999-2005, ISBN 978-1-931448-03-1, pp. 51-59, 85-91, 225.

Kazerounian et al., "A Single Poly EPROM for Custom CMOS Logic Applications", IEEE 1986 Custom Integrated Circuits Conference, 1986, pp. 59-62.

Kim et al., "A 30-MHz Hybrid Analog/Digital Clock Recovery Circuit in 2-um CMOS", IEEE Journal of Solid-State Circuits, vol. 25, No. 6, Dec. 1990, pp. 1385-1394.

Kim et al., "Low-Power High-Slew-Rate CMOS Buffer Amplifier for Flat Panel Display Drivers", Electronic Letters, Feb. 16, 2006, vol. 42, No. 4, <http://circuit.kaist.ac.kr/upload_files_pdf>, pp. 1-2.

Miyamoto et al., "An Experimental 5-V-Only 256-kbit CMOS EEPROM with a High-Performance Single-Polysilicon Cell", IEEE Journal of Solid State Circuits, vol. SC-21, No. 5, Oct. 1986, pp. 852-860.

Ohsaki et al., "A Planar Type EEPROM Cell Structure by Standard CMOS Process and Applications", VLSI Technology, Digest of Technical Papers, May 1993, pp. 55-66.

Ohsaki et al., "A Planar Type EEPROM Cell Structure by Standard CMOS Process for Integration with GATE Array, Standard Cell, Microprocessor and for Neural Chips", IEEE 1993 Custom Integrated Circuits Conference, 1993, pp. 23.6.6.1-23.6.6.4.

Ohsaki et al., "A Single Poly EEPROM Cell Structure for Use in Standard CMOS Processes", IEEE Journal of Solid State Circuits, vol. 29, No. 3, Mar. 1994, pp. 311-316.

Ohsaki et al., "SIPPOS (Single Poly Pure CMOS) EEPROM Embedded FPGA by News Ring Interconnection and Highway Path", IEEE 1994 Custom Integrated Circuits Conference, 1994, pp. 189-192.

Robert A. Blauschild, "WP 3.5: An Integrated Time Reference", ISSCC94/Session 3, Analog Techniques/Paper WP 3.5, Feb. 1994, pp. 56-58.

Robert Jania, "Cypress CapSense Successive Approximation Algorithm", Whiat Paper CSA RJO, Jan. 17, 2007, pp. 1-6.

S.M. Sze, "Physics of Semiconductor Devices", 2nd Edition, John Wiley & Sons, New York, 1981, pp. 496-506.

Sugino et al., "Analysis of Writing and Erasing Procedure of Flotox EEPROM using the New Charge Balance Condition (CBC) Model", NUPAD IV, May and Jun. 1992, pp. 65-69.

T.J Giles, " a University Frequency Synthesizer Ic", Philips Telecommunication Review, Aug. 1979, vol. 37, No. 3, pp. 177-181.

Universal Serial Bus Specification, Chapter 7—Electrical, Version 1.0, Jan. 15, 1996, pp. 111-143.

(56) References Cited

OTHER PUBLICATIONS

Takebuchi et al., "A Novel Integration Technology of EEPROM Embedded CMOS LOGIC VLSI Suitable for ASIC Applications", IEEE 992 Custom Integrated Circuits Conference, 1992, pp. 9.6.1-9.6.4.
Yoshikawa et al., "An EPROM Cell Structure for EPLD's Compatible with Single Poly-Si Gate Processes", IEEE Transactions on Electron Devices, vol. 37, No. 3, Mar. 1990, pp. 675-679.
USPTO Advisory Action for U.S. Appl. No. 13/100,876 dated Oct. 4, 2012, pp. 1-3.
USPTO Advisory Action for U.S. Appl. No. 14/066,263 dated Dec. 26, 2014, pp. 1-3.
USPTO Final Rejection for U.S. Appl. No. 13/100,876 dated Jul. 19, 2012, pp. 1-6.
USPTO Final Rejection for U.S. Appl. No. 14/066,263 dated Oct. 22, 2014, pp. 1-15.
USPTO Non-Final Rejection for U.S. Appl. No. 11/843,216 dated Oct. 6, 2009, pp. 1-7.
USPTO Non-Final Rejection for U.S. Appl. No. 13/100,876 dated Dec. 7, 2011, pp. 1-6.
USPTO Non-Final Rejection for U.S. Appl. No. 14/066,263 dated Sep. 25, 2014, pp. 1-13.
USPTO Notice of Allowance for U.S. Appl. No. 11/843,216 dated Feb. 22, 2010, pp. 1-6.
USPTO Notice of Allowance for U.S. Appl. No. 11/843,216 dated Mar. 1, 2012, pp. 1-7.
USPTO Notice of Allowance for U.S. Appl. No. 11/843,216 dated Apr. 19, 2011, pp. 1-7.
USPTO Notice of Allowance for U.S. Appl. No. 11/843,216 dated Jun. 15, 2010, pp. 1-6.
USPTO Notice of Allowance for U.S. Appl. No. 11/843,216 dated Dec. 29, 2011, pp. 1-7.
USPTO Notice of Allowance for U.S. Appl. No. 13/100,876 dated May 17, 2013, pp. 1-8.
USPTO Notice of Allowance for U.S. Appl. No. 13/100,876 dated Jul. 24, 2013, pp. 1-8.
USPTO Notice of Allowance for U.S. Appl. No. 13/100,876 dated Sep. 3, 2013, pp. 1-8.
USPTO Notice of Allowance for U.S. Appl. No. 14/066,263 dated Mar. 6, 2015, pp. 1-9.
USPTO Notice of Allowance for U.S. Appl. No. 14/066,263 dated Apr. 14, 2015, pp. 1-8.
USPTO Notice of Allowance for U.S. Appl. No. 14/066,263 dated Aug. 7, 2015, pp. 1-2.

\* cited by examiner

LOAD DRIVER

RELATED APPLICATIONS

This application is a continuation of U.S. patent application Ser. No. 14/829,938, filed Aug. 19, 2015, now U.S. Pat. No. 9,923,559 issued on Mar. 20, 2018, which is a continuation of U.S. patent application Ser. No. 14/066,263, filed Oct. 29, 2013, now U.S. Pat. No. 9,124,264 issued on Sep. 1, 2015, which is a continuation of U.S. patent application Ser. No. 13/100,876, filed May 4, 2011, now U.S. Pat. No. 8,570,073 issued on Oct. 29, 2013, which is a continuation of U.S. patent application Ser. No. 11/843,216, filed Aug. 22, 2007, now U.S. Pat. No. 8,164,365 issued on Apr. 24, 2012, which claims the priority benefit of U.S. Provisional Application No. 60/912,577, filed Apr. 18, 2007, all of which are incorporated by reference herein in their entirety.

TECHNICAL FIELD

The present disclosure relates generally to integrated circuits, and more particularly to a method and apparatus to drive non-resistive loads.

BACKGROUND

A conventional load driver circuit may include an operational amplifier (Op-Amp) and a Metal-Oxide-Semiconductor (MOS) power transistor. The MOS power transistor defines a current path from its drain to its source upon receiving an appropriate drive signal at its gate. The gate of the MOS power transistor may be connected to an output of the Op-Amp that includes an inverting input and a non-inverting input. The inverting input of the Op-Amp may be connected to the source of the MOS power transistor via a feedback path. A load may be connected to the source or the drain of the MOS power transistor.

This conventional load driver circuit works well for driving resistive loads. However, there are several limitations when using this circuit to drive non-resistive loads, including capacitive loads, e.g., a liquid crystal display (LCD) panel, and inductive loads. For example, the conventional load driver circuit may become less stable when driving a non-resistive load, which in turn makes it difficult to drive rail-to-rail voltages to an output of the conventional load driver circuit. Additionally, the conventional load driver circuit may be less resilient to load variations. Any load variation may cause the circuit to become less stable. One solution may be to include capacitors in the feedback path of the conventional load driver circuit. But this solution increases the number of components in the conventional load driver circuit, thus increasing cost.

DESCRIPTION OF EXAMPLE EMBODIMENTS

Overview

A device includes a voltage generator to generate an input voltage; a first circuit to drive a voltage associated with a load to a threshold voltage level; and a second circuit to adjust the voltage associated with the load to approximate the input voltage, and to stabilize the voltage associated with the load. The device further includes a control logic having a control signal generator to generate signals to select between the first circuit and the second circuit.

A method includes providing an input voltage; driving a voltage associated with a load to a threshold level during a high-drive mode; adjusting the voltage associated with the load to approximate the input voltage during a low-drive mode; and stabilizing the voltage associated with the load during the low-drive mode. The method further includes generating control signals to select between a high-drive mode and a low-drive mode.

BRIEF DESCRIPTION OF THE DRAWINGS

The foregoing and other objects, advantages and features will become more readily apparent by reference to the following detailed description in conjunction with the accompanying drawings.

DETAILED DESCRIPTION

Figure 1:
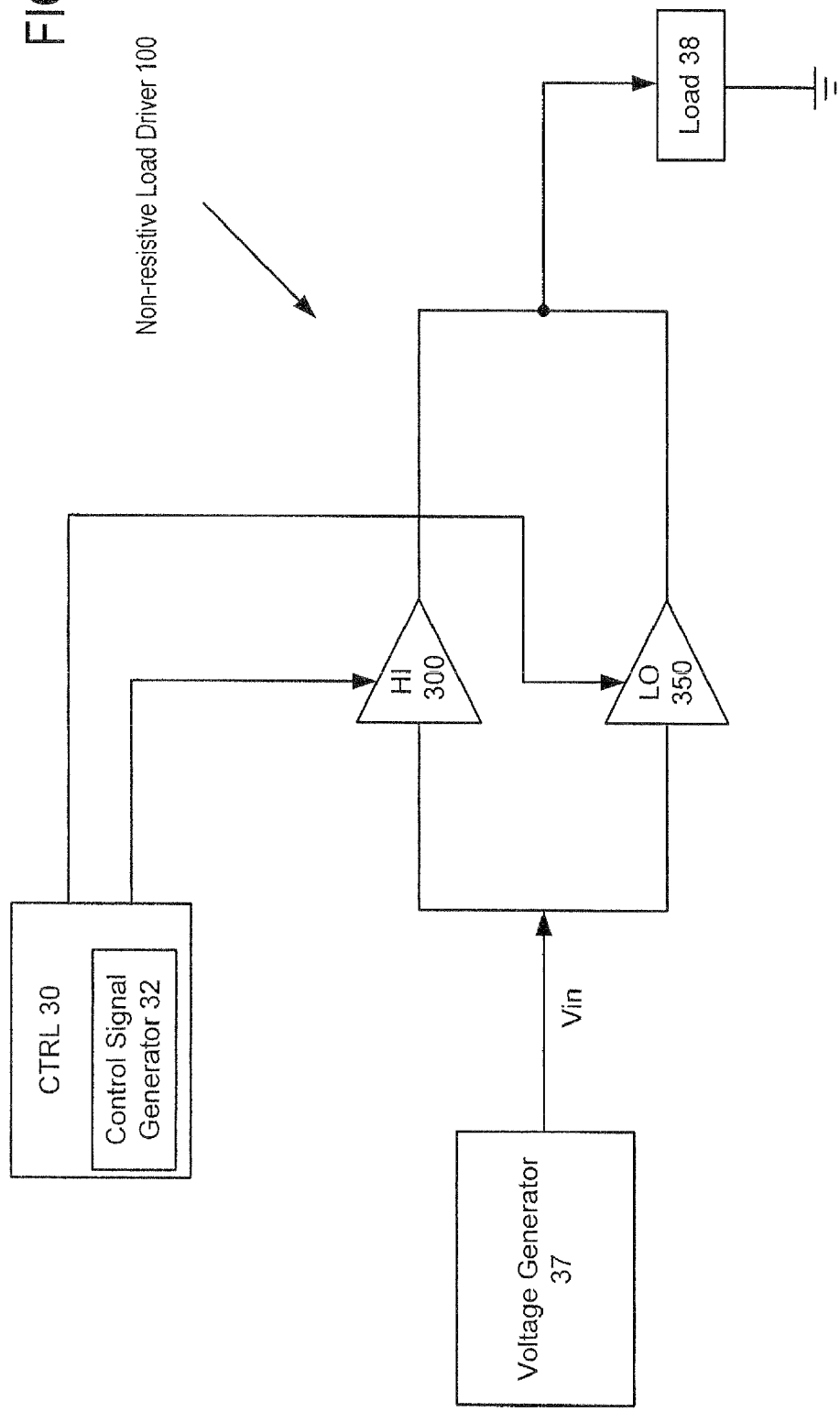
FIG. 1 is a schematic block diagram illustrating an example non-resistive load driver according to embodiments of the invention.

FIG. 1 is a schematic block diagram illustrating an example non-resistive load driver 100 according to embodiments of the invention. It should be recognized that FIG. 1 may include other elements, which are not illustrated in order to simplify the figures and which are not necessary to understand the example system disclosed below. The non-resistive load driver circuit 100 described and illustrated herein may be implemented in hardware, firmware, software, or any suitable combination thereof.

Referring to FIG. 1, the non-resistive load driver 100 may include a high-drive circuit 300 and a low-drive circuit 350 to drive rail-to-rail voltages at an output of the non-resistive load driver 100. The high-drive circuit 300 may actively drive the load 38 to a threshold voltage level, while the low-drive circuit 350 may modify the output voltage of the non-resistive load driver 100 (i.e., voltage level associated with the load 38) to approximate an input voltage Vin, as well as maintain a stable output voltage for the non-resistive load driver 100. Vin represents an input voltage to the non-resistive load driver 100. The input voltage Vin may be generated from a voltage generator 37. The control logic 30 includes a control signal generator 32 to generate appropriate control signals, to select either the high-drive circuit 300 or the low-drive circuit 350 to drive the load 38. The control logic 30 may also control the amount of time that each circuit 300 and 350 operates. The amount of time that each circuit 300 and 350 operates may be programmable for a dynamic switching between the circuits 300 and 350 or fixed depending on the load 38. In some embodiments, the non-resistive load driver 100 may drive capacitive loads, such as a liquid crystal display (LCD) panel.

In some embodiments, the non-resistive load driver 100 may operate in a high-drive mode and a low-drive mode to drive rail-to-rail voltages at an output of the non-resistive load driver 100. During the high-drive mode, the high-drive circuit 300 may be selected to actively drive the load 38 to a threshold voltage level. The threshold voltage level may offset the input voltage Vin by a small amount, and its value may be programmable or fixed. Subsequently, the non-resistive load driver 100 may switch to a low-drive mode in which the low-drive circuit 350 is activated. During the low-drive mode, the low-drive circuit 350 may modify the output voltage of the non-resistive load driver 100, i.e., voltage level associated with the load 38, to approximate the input voltage Vin. In addition, during the low-drive mode, the low-drive circuit 350 may stabilize the output voltage of the non-resistive load driver 100 to maintain a steady state. The low-drive circuit 350 consumes less current than the high-drive circuit 300, thereby reducing power consumption.

When driving an LCD panel, the non-resistive load driver 100 may cease to drive the LCD panel, or switch to a no-drive mode, after the output voltage of the non-resistive load driver 100 reaches a steady state. In this no-drive mode, both the high-drive circuit 300 and the low-drive circuit 350 may be turned off, further reducing power consumption. When driving non-capacitive loads, such as inductive loads, the low-drive circuit 350 may remain turned on to maintain an appropriate voltage at the output of the non-resistive load driver 100.

The control logic 30 may provide appropriate control signals to the non-resistive load driver 100 to indicate which mode of operation, e.g., the high-drive mode, the low-drive mode, or the no-drive mode, may be used for driving a non-resistive load. The timing associated with each of these modes may be programmable for a dynamic switching between the modes or fixed depending on the load 38. In some embodiments, the non-resistive load driver 100 may be implemented using two or more discrete drivers, such as a high-drive circuit 300 and a low-drive circuit 350, while in other embodiments, the non-resistive load driver 100 may be implemented using a single driver with two or more operational modes controllable by a bias current.

In some embodiments, the low-drive circuit 350 may include a chopper-stabilized amplifier that switches between an input and an output of the non-resistive load driver 100 to cancel out any offset voltages. A chopping frequency associated with the chopper-stabilized amplifier may be programmable when using the chopper-stabilized amplifier to drive non-resistive loads.

The above-described non-resistive load driver 100 includes a high-drive circuit 300 and a low-drive circuit 350 that allows for rail-to-rail output voltage drive capability while maintaining stability, when driving non-resistive loads. The non-resistive load driver 100 does not require additional capacitors to keep the circuit stable, thereby consuming less chip space. These external capacitors are typically required by the conventional load driver circuits to support large transient current flows. Additionally, the non-resistive load driver 100 consumes less power when driving non-resistive loads.

Figure 2:
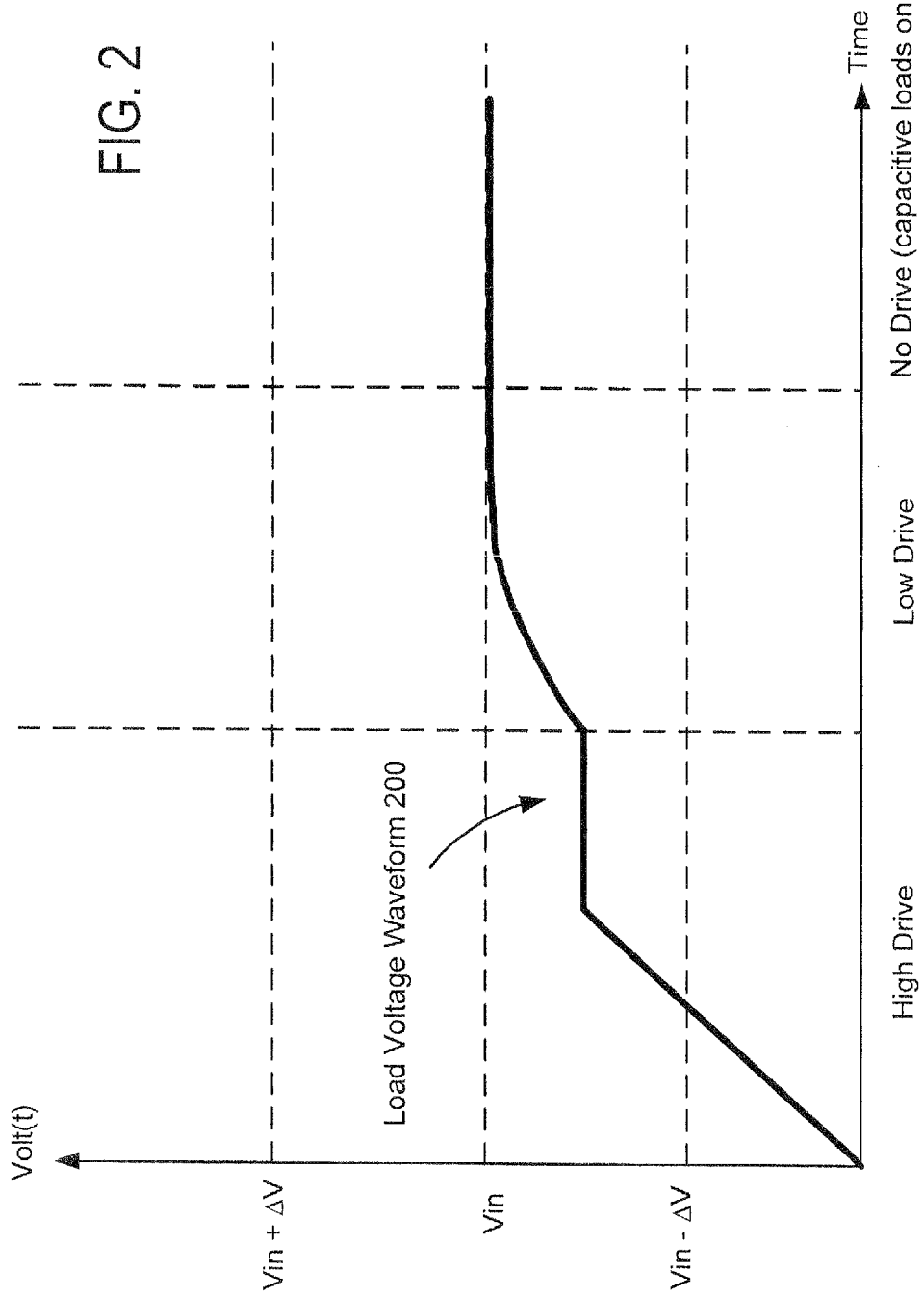
FIG. 2 is a diagram illustrating an example operation of the non-resistive load driver of FIG. 1 for an example load voltage waveform.

FIG. 2 is a diagram illustrating an example operation of the non-resistive load driver 100 of FIG. 1 for an example load voltage waveform 200. Referring to FIG. 2, the load voltage waveform 200 may represent instantaneous voltages associated with the load 38 as a function of time. Vin represents an input voltage to the non-resistive load driver 100. The input voltage Vin may be generated from the voltage generator 37 of FIG. 1. An offset voltage ΔV may be a relatively small voltage compared to the input voltage Vin. A voltage window (Vin−ΔV, Vin+ΔV) may be a voltage range to drive the output of the non-resistive load driver 100.

The non-resistive load driver 100 may operate in a high-drive mode such that the high-drive circuit 300 is selected to drive a load voltage to a value within the voltage window (Vin−ΔV, Vin+ΔV). The load voltage may offset the input voltage Vin by a small amount ΔV. Subsequently, the non-resistive load driver 100 may switch to a low-drive mode. In one embodiment, the high-drive circuit may automatically turn off itself after charging to a certain threshold level, while the low-drive mode may be automatically and dynamically turned on/off to stabilize the output voltage. During the low-drive mode, the low-drive circuit 350 is selected to modify the load voltage to approximate the input voltage Vin, such as by canceling any offset voltages associated with the load voltage. In addition, the low-drive circuit 350 may also stabilize the load voltage to maintain a steady state. The low-drive circuit 350 consumes less current than the high-drive circuit 300, thus reducing power consumption. When driving capacitive loads, the non-resistive load driver 100 may switch to a no-drive mode after the load voltage reaches a steady state. During the no-drive mode, both the high-drive circuit 300 and the low-drive circuit 350 may be turned off, further reducing power consumption.

Figure 3:
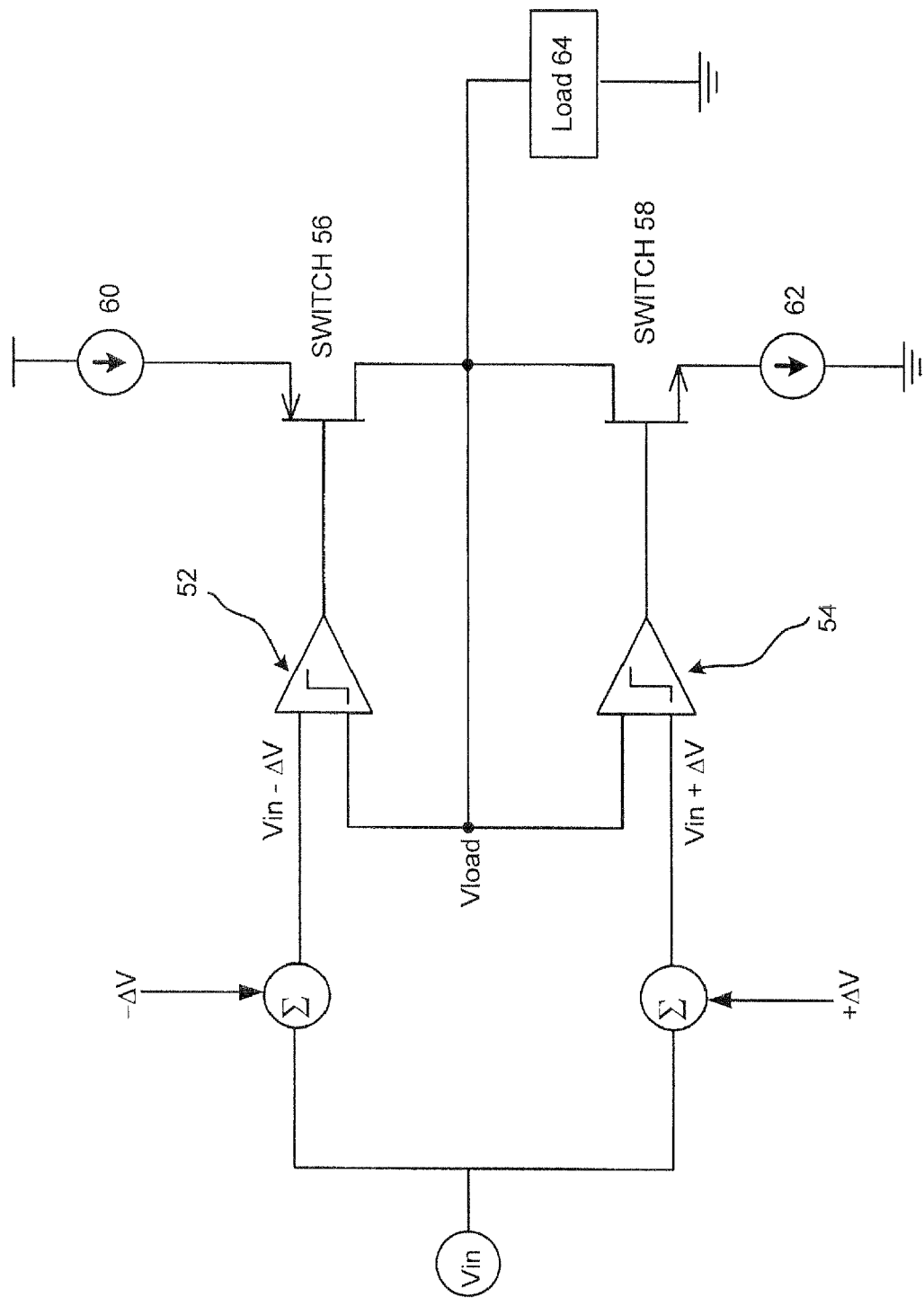
FIG. 3 is a schematic block diagram illustrating an example high-drive circuit of the non-resistive load driver of FIG. 1.

FIG. 3 is a schematic block diagram illustrating an example high-drive circuit 300 of the non-resistive load driver 100 of FIG. 1. Referring to FIG. 3, the example high-drive circuit 300 may include comparators 52 and 54, switches 56 and 58, current sources 60 and 62, to drive a load 64. Comparators 52 and 54 compare multiple voltages or currents and switch their respective output to indicate which voltage or current is larger. The output of comparators 52 and 54 controls switches 56 and 58, respectively. In some embodiments, the switch 56 may be a p-channel metal-oxide-semiconductor field-effect transistor (MOSFET) PMOS, whereas the switch 58 may be an NMOS. In other embodiments, the switches 56 and 58 may be any other device capable of performing the functions described herein.

Vin represents an input voltage to the high-drive circuit 300. The input voltage Vin may be generated from the voltage generator 37 of FIG. 1. An offset voltage ΔV may be a relatively small voltage compared to the input voltage Vin. A voltage window (Vin−ΔV, Vin+ΔV) may be a voltage range to drive the output of the high-drive circuit 300. A load voltage Vload may represent instantaneous voltages associated with the load 64 as a function of time.

The comparator 52 compares the value of the input voltage minus the offset voltage or Vin−ΔV with the load voltage Vload. In some embodiments, the comparator 52 outputs a "1" when Vin−ΔV is less than the load voltage Vload, thus directing the switch 56 to be turned off. Otherwise, the comparator 52 outputs a "0" when Vin−ΔV is greater than the load voltage Vload, thus directing the switch 56 to be turned on.

The Comparator 54 compares the value of the input voltage plus the offset voltage or Vin+ΔV with the load voltage Vload. When the load voltage Vload is less than Vin+ΔV, the switch 58 is turned off. Otherwise, when the load voltage Vload is greater than Vin+ΔV, the switch 58 is turned on.

When the switch 56 is on and the switch 58 is off, a large bias current may flow from the current source 60 to the load 64 to charge the load 64 until the load voltage Vload reaches a value within the window (Vin−ΔV, Vin+ΔV). Once the load voltage Vload is charged to a value within the window (Vin−ΔV, Vin+ΔV), both switches 56 and 58 may be off. When both switches 56 and 58 are off, the high-drive circuit 300 may be turned off to cease to drive the load 64. The low-drive circuit 350 may then be activated to modify or adjust the load voltage Vload to approximate the input voltage Vin and to stabilize the load voltage Vload.

On the other hand, when the switch 56 is off and the switch 58 is on, a large bias current may flow from the load 64 to the current source 62 to discharge the load 64 until the load voltage Vload reaches a value within the window (Vin−ΔV, Vin+ΔV). Once the load voltage Vload is discharged to a value within the window (Vin−ΔV, Vin+ΔV), both switches 56 and 58 may be off. When both switches 56 and 58 are off, the high-drive circuit 300 may be turned off to cease to drive the load 64. The low-drive circuit 350 may then be activated to modify or adjust the load voltage Vload to approximate the input voltage Vin and to stabilize the load voltage Vload.

Embodiments of the invention relate to a method and apparatus to drive non-resistive loads. The non-resistive load driver may include two or more drivers, such as a high-drive circuit 300 and a low-drive circuit 350, to drive rail-to-rail output voltages and to maintain a stable condition. The high-drive circuit may drive the output voltage to a threshold level, whereas the low-drive circuit may modify the output voltage to approximate an input voltage of the non-resistive load driver, and maintain a steady state output voltage. The low-drive circuit consumes less current than the high-drive circuit. The non-resistive load driver consumes less power and use less chip space.

Further modifications and alternative embodiments of this invention will be apparent to those skilled in the art in view of this description. For example, the non-resistive load driver 100 may be implemented using a single driver with multiple modes, such as a low-drive mode and a high-drive mode, by changing a bias current of the non-resistive load driver 100 between a high current mode and a low current mode. Accordingly, this description is to be construed as illustrative only and is for the purpose of teaching those skilled in the art the manner of carrying out the invention. Various changes may be made in the shape, size and arrangement and types of components or devices. For example, equivalent elements or materials may be substituted for those illustrated and described herein, and certain features of the invention may be utilized independently of the use of other features, all as would be apparent to one skilled in the art after having the benefit of this description of the invention. Alternative embodiments are contemplated and are within the spirit and scope of the following claims.

What is claimed is:

1. A device, comprising:
    a first circuit configured to drive an output terminal to a first voltage; and
    a second circuit configured to adjust the first voltage at the output terminal to a second voltage,
    wherein the first circuit and the second circuit are configured to be operational alternatively, and
    wherein the first and second circuits are configured to be turned off when the second voltage reaches a steady state.

2. The device of claim 1, wherein the output terminal is configured to drive an electronic display.

3. A device, comprising:
    a first circuit configured to drive an output terminal to a first voltage, wherein the first voltage is configured to be within a voltage range defined by an upper voltage and a lower voltage; and
    a second circuit configured to adjust the first voltage at the output terminal to a second voltage, wherein the first circuit and the second circuit are configured to be operational alternatively, wherein the first circuit comprises:
        a first comparator configured to control a first switch according to at least an outcome of comparing the first voltage to the lower voltage; and
        a second comparator configured to control a second switch according to at least an outcome of comparing the first voltage to the upper voltage.

4. The device of claim 3, further comprising:
    a first current source configured to charge the output terminal when the first switch is turned on; and
    a second current source configured to discharge the output terminal when the second switch is turned on.

5. A method comprising:
    driving a load to a first voltage within a voltage window, the voltage window based on at least an input voltage and an offset voltage;
    adjusting the first voltage to a second voltage, the second voltage approximates the input voltage;
    configuring the driving the load to the first voltage and the adjusting the first voltage to the second voltage to operate alternatively; and
    configuring the voltage window to be defined by an upper voltage and a lower voltage,
    wherein the upper voltage is substantially a sum of the input voltage and the offset voltage,
    wherein the lower voltage is substantially a difference between the input voltage and the offset voltage.

6. A device comprising:
    a circuit configured to:
        drive a load to an initial non-zero voltage within a voltage window, the voltage window based on an input voltage and an offset voltage;
        drive the load to approximately the input voltage in response to driving the load to the initial non-zero voltage; and
        be turned off when the load is at a steady state voltage, the steady state voltage being approximately the input voltage.

7. The device of claim 6, further comprising:
    an electronic display device, the electronic display device coupled to the circuit and providing the load.

8. The device of claim 7, wherein the electronic display device comprises a liquid crystal display panel.

* * * * *